(12) United States Patent
Li et al.

(10) Patent No.: US 11,362,301 B2
(45) Date of Patent: Jun. 14, 2022

(54) DISPLAY PANEL AND DISPLAY DEVICE

(71) Applicant: Wuhan Tianma Micro-Electronics Co., Ltd., Wuhan (CN)

(72) Inventors: Jiaxin Li, Wuhan (CN); Yu Cai, Wuhan (CN); Shucheng Ge, Wuhan (CN); Yuanyuan Rao, Wuhan (CN); Dan Huang, Wuhan (CN); Yaqi Kuang, Shanghai (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 237 days.

(21) Appl. No.: 16/879,544

(22) Filed: May 20, 2020

(65) Prior Publication Data
US 2021/0210713 A1 Jul. 8, 2021

(30) Foreign Application Priority Data

Jan. 2, 2020 (CN) .......................... 202010000663.9

(51) Int. Cl.
*H01L 51/00* (2006.01)
*H01L 51/52* (2006.01)
*H01L 27/32* (2006.01)
*H01L 51/50* (2006.01)
*H01L 51/56* (2006.01)
*H01L 27/12* (2006.01)

(52) U.S. Cl.
CPC ........ *H01L 51/525* (2013.01); *H01L 27/3211* (2013.01); *H01L 27/3246* (2013.01); *H01L 27/3248* (2013.01); *H01L 27/3262* (2013.01); *H01L 27/3265* (2013.01); *H01L 27/3276* (2013.01); *H01L 51/504* (2013.01); *H01L 51/5268* (2013.01); *H01L 51/56* (2013.01); *H01L 27/124* (2013.01); *H01L 27/1255* (2013.01); *H01L 2227/323* (2013.01)

(58) Field of Classification Search
CPC ............... H01L 51/525; H01L 27/3211; H01L 27/3248; H01L 27/3262; H01L 51/504; H01L 51/5268; H01L 27/1255
See application file for complete search history.

(56) References Cited

FOREIGN PATENT DOCUMENTS

| CN | 108010947 A | 5/2018 |
|---|---|---|
| CN | 109979979 A | 7/2019 |
| CN | 110492018 A | 11/2019 |
| CN | 110504289 A | 11/2019 |

*Primary Examiner* — Samuel A Gebremariam
(74) *Attorney, Agent, or Firm* — Anova Law Group, PLLC (57) ABSTRACT

A display panel and a display device are provided. The display panel includes a display region, a hole-digging region, and a boundary region disposed between the display region and the hole-digging region. The display panel also includes an array substrate and a light-emitting function layer. The array substrate includes a dam structure disposed between the display region and the boundary region. The light-emitting function layer covers the array substrate, and includes a first light-emitting component disposed over the display region and a second light-emitting component disposed over the boundary region. The array substrate further includes a base substrate and a driving device layer, and the driving device layer includes a first thin-film transistor device layer and a boundary driving circuit layer. The first thin-film transistor device layer is electrically connected to the first light-emitting component, and the boundary driving circuit layer is electrically connected to the second light-emitting component.

20 Claims, 10 Drawing Sheets

DISPLAY PANEL AND DISPLAY DEVICE

CROSS-REFERENCES TO RELATED APPLICATIONS

This application claims the priority of Chinese patent application No. 202010000663.9, filed on Jan. 2, 2020, the entirety of which is incorporated herein by reference.

FIELD

The present disclosure generally relates to the field of display device technology and, more particularly, relates to a display panel, and a display device.

BACKGROUND

At present, to achieve a full-screen design of a display device, the design of the display device often adopts an irregularly-shaped screen structure. In other words, a cutting hole is formed in the display region of the display panel, and a front camera is disposed in the cutting hole. Such structure can reduce a width of a border region of the display device. However, in such structure, components originally disposed in the border region, e.g., a front flashlight, and an alert light for special reminders, etc., are eliminated, and the front lighting function and special reminder function cannot be realized. The disclosed display panel and display device are directed to solve one or more problems set forth above and other problems.

SUMMARY

One aspect of the present disclosure provides a display panel. The display panel includes a display region, a hole-digging region surrounded by the display region, and a boundary region disposed between the display region and the hole-digging region. The display panel also includes an array substrate and a light-emitting function layer. The array substrate includes a dam structure disposed between the display region and the boundary region and surrounding the hole-digging region. The light-emitting function layer covers the array substrate, and includes a first light-emitting component disposed over the display region and a second light-emitting component disposed over the boundary region. The array substrate further includes a base substrate and a driving device layer disposed over the base substrate, and the driving device layer includes a first thin-film transistor device layer disposed over the display region and a boundary driving circuit layer disposed over the boundary region. The first thin-film transistor device layer is electrically connected to the first light-emitting component, and the boundary driving circuit layer is electrically connected to the second light-emitting component.

Another aspect of the present disclosure provides a display device. The display device includes a display panel. The display panel includes a display region, a hole-digging region surrounded by the display region, and a boundary region disposed between the display region and the hole-digging region. The display panel also includes an array substrate and a light-emitting function layer. The array substrate includes a dam structure disposed between the display region and the boundary region and surrounding the hole-digging region. The light-emitting function layer covers the array substrate, and includes a first light-emitting component disposed over the display region and a second light-emitting component disposed over the boundary region. The array substrate further includes a base substrate and a driving device layer disposed over the base substrate, and the driving device layer includes a first thin-film transistor device layer disposed over the display region and a boundary driving circuit layer disposed over the boundary region. The first thin-film transistor device layer is electrically connected to the first light-emitting component, and the boundary driving circuit layer is electrically connected to the second light-emitting component.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
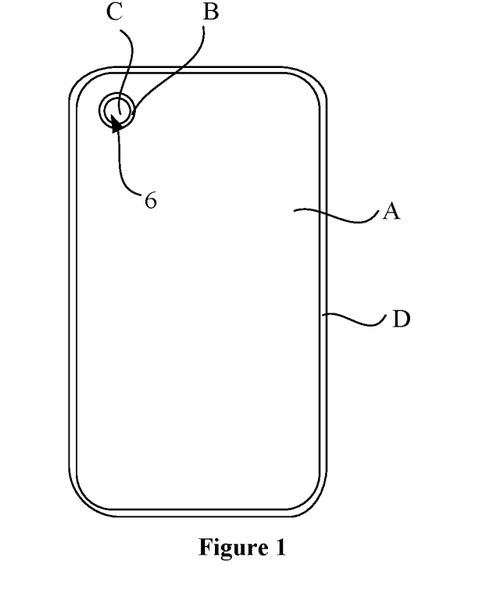
FIG. 1 illustrates a schematic diagram of an exemplary display panel consistent with disclosed embodiments of the present disclosure.

The present disclosure provides a display panel. Referring to FIG. 1, the display panel may include a display region A, a hole-digging region C surrounded by the display region A, and a boundary region B disposed between the display region A and the hole-digging region C. The hole-digging region C may be configured to form a through-hole 6 penetrating through the display panel and configured for disposing a camera.

Figure 2:
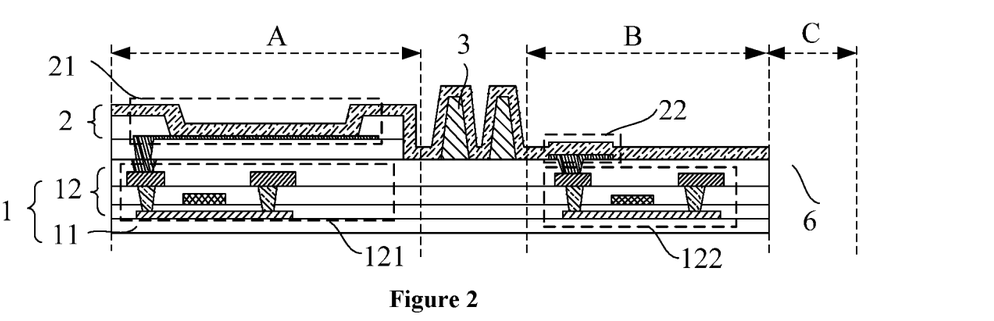
FIG. 2 illustrates a cross-sectional view of an exemplary display panel consistent with disclosed embodiments of the present disclosure.

In one embodiment, referring to FIG. 2, the display panel may include an array substrate 1 and a light-emitting function layer 2. The array substrate 1 may include a dam structure 3 disposed between the display region A and the boundary region B and surrounding the hole-digging region C. The light-emitting function layer 2 may cover the array substrate 1. The light-emitting function layer 2 may include a first light-emitting component 21 disposed over the display region A and a second light-emitting component 22 disposed over the boundary region B.

The array substrate 1 may further include a base substrate 11 and a driving device layer 12 disposed on the base substrate 11. The driving device layer 12 may include a first thin-film transistor device layer 121 disposed over the display region A and a boundary driving circuit layer 122 disposed over the boundary region B.

The first thin-film transistor device layer 121 may be electrically connected to the first light-emitting component 21, and the boundary driving circuit layer 122 may be electrically connected to the second light-emitting component 22.

The disclosed display panel in the present disclosure may include the display region A, the hole-digging region C surrounded by the display region A, and the boundary region B disposed between the display region A and the hole-digging region C. In one embodiment, the display panel may include the array substrate 1 and the light-emitting function layer 2 disposed on the array substrate 1. The array substrate 1 may include the base substrate 11 and the driving device layer 12 disposed on the base substrate 11. The driving device layer 12 may include the boundary driving circuit layer 122 disposed over the boundary region B surrounding the hole-digging region C. The light-emitting function layer 2 may include at least one second light-emitting component 22. The driving device layer 12 may be electrically connected to a second light-emitting component 22 of the at least one second light-emitting component 22. In such structure, the driving device layer may drive the second light-emitting component to emit light, such that the boundary region around the hole-digging region may have a display or light-emitting effect, may effectively utilize the region around the hole-digging region, may increase the function structure of the display panel, and may improve user's experience.

In one embodiment, the light-emitting effect of the second light-emitting component may be configured to have a function, e.g., a special reminder function, a lighting function, or a display function, etc.

Figure 3:
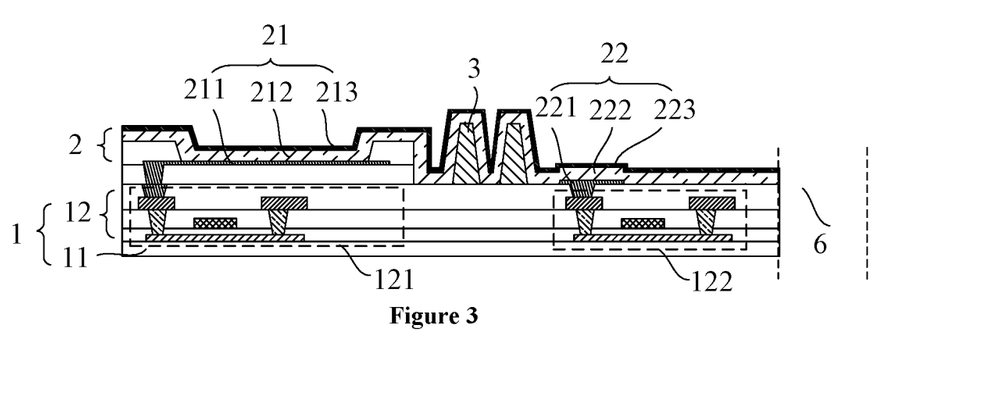
FIG. 3 illustrates a cross-sectional view of another exemplary display panel consistent with disclosed embodiments of the present disclosure.

In the disclosed display panel, in one embodiment, referring to FIG. 3, the first light-emitting component 21 disposed over the display region A may be an organic electroluminescent device. The first light-emitting component 21 may include a first anode 211, a first organic light-emitting layer 212, and a first cathode 213 that are sequentially stacked over the display region A. The second light-emitting component 22 disposed over the boundary region B may be an organic electroluminescent device. The second light-emitting component 22 may include a second anode 221, a second organic light-emitting layer 222, and a second cathode 223 that are sequentially stacked over the boundary region B.

Each film layer in the organic electroluminescent device may be formed by an evaporation process. The cathode may often be formed by directly evaporating cathode metal layer on the entire surface of the array substrate. Therefore, in the disclosed embodiments of the present disclosure, the first cathode 213 of the first light-emitting component 21 and the second cathode 223 of the second light-emitting component 22 may be same-layer formed. The same-layer formation may refer to that at least two structures may be formed through a same fabrication process.

In one embodiment, because the first cathode 213 and the second cathode 223 are formed by an evaporation process, the same-layer formation of the first cathode 213 and the second cathode 223 may refer to being formed by an entire-surface-evaporation on the array substrate 1 through a same evaporation process. Referring to FIG. 3, the second organic light-emitting layer 222 may be same-layer formed with the first organic light-emitting layer 212 by an entire-surface-evaporation, or may be separately formed over the boundary region. The first anode 211 and the second anode 221 may be same-layer formed by an entire-surface-evaporation followed by a patterning process.

In one embodiment, when the second organic light-emitting layer 222 is separately formed over the boundary region, the light-emitting region of the second light-emitting component 22 may be limited by setting the structure of the second organic light-emitting layer 222.

Figure 4:
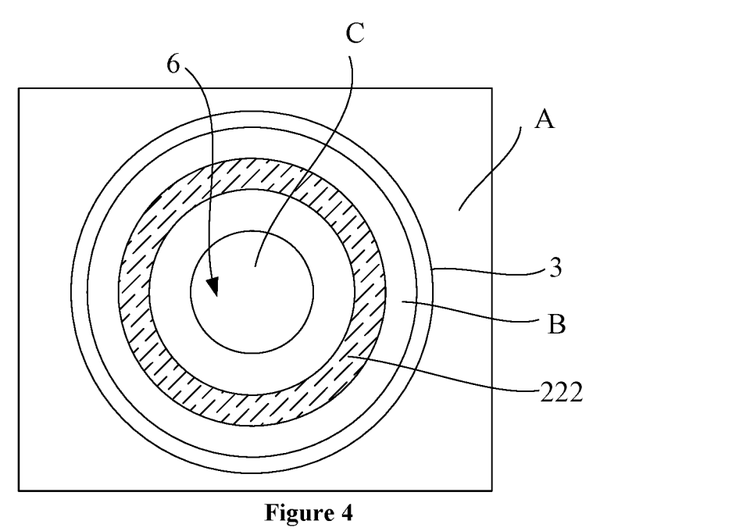
FIG. 4 illustrates a schematic diagram of an exemplary second organic light-emitting layer consistent with disclosed embodiments of the present disclosure.

In one embodiment, referring to FIG. 4, the second organic light-emitting layer 222 may have a ring structure surrounding the hole-digging region C. An orthographic projection of the second organic light-emitting layer 222 on the array substrate may be within an orthographic projection of the second anode 221 on the array substrate. The light-emitting region of the second light-emitting component 22 may be a circular light-emitting region surrounding the hole-digging region C. The circular light-emitting region may surround the hole-digging region C, which may have a beautiful structure, and may effectively utilize the boundary region B around the hole-digging region C, thereby improving the user's experience.

In one embodiment, the second organic light-emitting layer 222 having the ring structure may be any one of a red organic light-emitting layer R, a blue organic light-emitting layer B, or a green organic light-emitting layer G. For example, referring to FIG. 5a, the second organic light-emitting layer 222 may be a red organic light-emitting layer R.

Figure 5A:
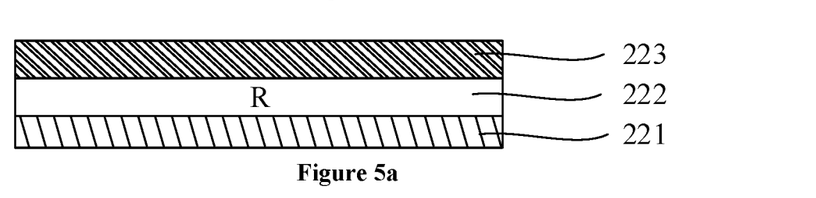
FIG. 5a illustrates a cross-sectional view of another exemplary second organic light-emitting layer consistent with disclosed embodiments of the present disclosure.
Figure 5B:
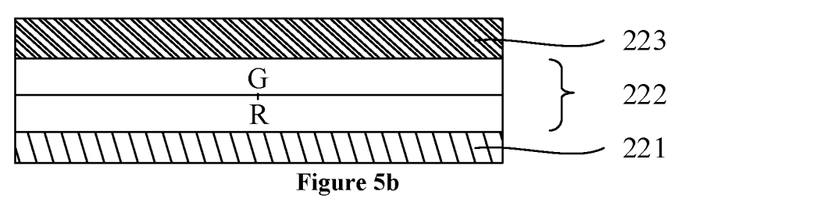
FIG. 5b illustrates a cross-sectional view of another exemplary second organic light-emitting layer consistent with disclosed embodiments of the present disclosure.
Figure 5C:
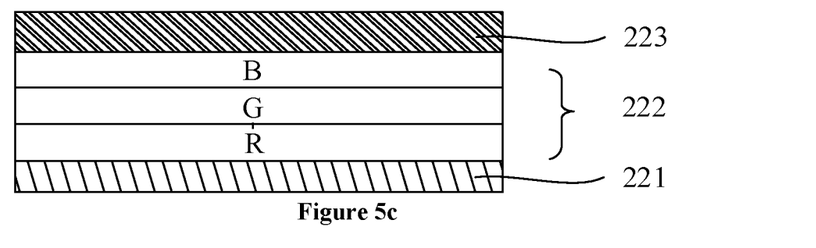
FIG. 5c illustrates a cross-sectional view of another exemplary second organic light-emitting layer consistent with disclosed embodiments of the present disclosure.

In another embodiment, the second organic light-emitting layer 222 may include at least two layers of a red organic light-emitting layer R, a blue organic light-emitting layer B, and a green organic light-emitting layer G. For example, referring to FIG. 5b, the second organic light-emitting layer 222 may include a red organic light-emitting layer R and a blue organic light-emitting layer B that are sequentially stacked. Referring to FIG. 5c, the second organic light-emitting layer 222 may include a red organic light-emitting layer R, a green organic light-emitting layer G, and a blue organic light-emitting layer B that are sequentially stacked.

When the second organic light-emitting layer 222 includes at least two sequentially stacked organic light-emitting layers of different colors, the light emitted from the second organic light-emitting layer 222 may be a mixed light of the light emitted from each stacked organic light-emitting layer. In the structures as illustrated in FIGS. 5a-5c, the second organic light-emitting layer 222 may emit light of a single color. In view of this, the second light-emitting component 22 may be configured for special reminder or lighting. The special reminder function may include call reminder, message reminder, etc., and the lighting function may include general lighting or photography supplementary lighting.

Figure 6:
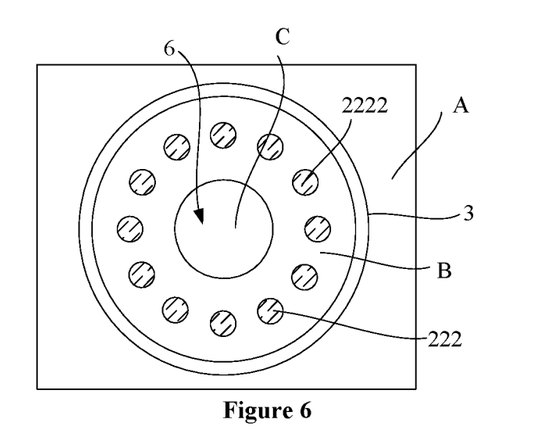
FIG. 6 illustrates a schematic diagram of another exemplary second organic light-emitting layer consistent with disclosed embodiments of the present disclosure.

In one embodiment, referring to FIG. 6, the second organic light-emitting layer 222 may have a scatter structure surrounding the hole-digging region C. Each scattered point in the scatter structure may be distributed in a ring coaxial with the hole-digging region C. The light-emitting region of the second light-emitting component 22 may be a scattered light-emitting region surrounding the hole-digging region C. The light-emitting pattern may be beautiful and concise, which may increase the user's experience.

In one embodiment, referring to FIG. 6, there may be 12 scattered points 2222 of the second organic light-emitting layer 222 around the hole-digging region C. The light emitted by the 12 scattered points may have a same or different color. When there is one second anode 221, and orthographic projections of the 12 scattered points 2222 on the array substrate are within the orthographic projection of the second anode 221 on the array substrate, the light-emitting state of the scattered point 2222 may be changed by changing a voltage between the second anode 221 and the second cathode 223. The light-emitting state of the scattered point may include whether to emit light and the brightness of the light. In one embodiment, the light emitted by the 12 scattered points may be configured for a special reminder function, or may be configured for a lighting function, etc.

Figure 7:
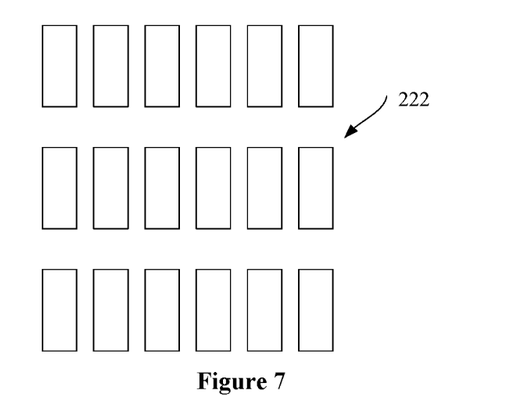
FIG. 7 illustrates a schematic diagram of another exemplary second organic light-emitting layer consistent with disclosed embodiments of the present disclosure.

In one embodiment, referring to FIG. 7, the second organic light-emitting layer 222 may have an array structure surrounding the hole-digging region C, such that the light-emitting region of the second light-emitting component 22 may be an array-shaped light-emitting region surrounding the hole-digging region C. For example, when there is one second anode 221, and an orthographic projection of the array structure of the second light-emitting structure 22 on the array substrate is within the orthographic projection of the second anode 221 on the array substrate, the light-emitting state of the array structure may be changed by changing the voltage between the second anode 221 and the second cathode 223. In the array structure, the light emitted by each unit may be the same or different. In view of this, light emitted by the second light-emitting component 22 may be configured for a special reminder function, or may be configured for a lighting function, etc.

In the disclosed display panel of the present disclosure, referring to FIG. 3, the first organic light-emitting layer 212 and the second organic light-emitting layer 222 may be same-layer formed. In other words, the first organic light-emitting layer 212 and the second organic light-emitting layer 222 may be formed on the array substrate by an entire-surface-evaporation through a same evaporation process. In such structure, the light-emitting region of the second light-emitting component 22 may be limited by setting the structure of the second anode 221.

Figure 8:
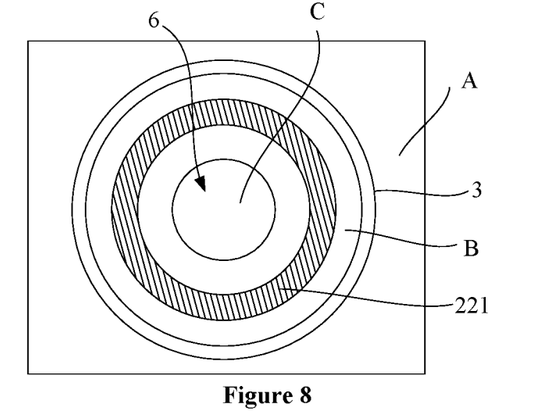
FIG. 8 illustrates a schematic diagram of an exemplary second anode consistent with disclosed embodiments of the present disclosure.

In one embodiment, referring to FIG. 8, the second anode 221 may have a ring structure surrounding the hole-digging region C, and the light-emitting region of the second light-emitting component 22 may be a circular light-emitting region. The light-emitting region may be beautiful and concise, which may achieve the special reminder function or lighting function of the device, and may improve the user's experience.

Figure 9:
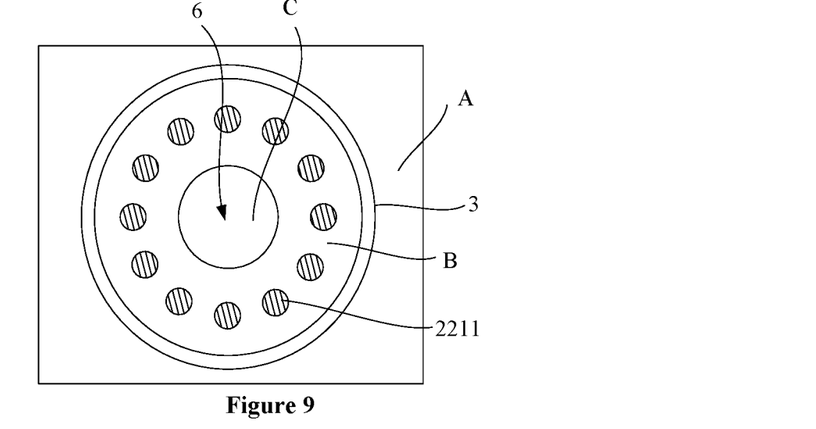
FIG. 9 illustrates a schematic diagram of another exemplary second anode consistent with disclosed embodiments of the present disclosure.

In one embodiment, referring to FIG. 9, the second anode 221 may be disposed as a scatter structure surrounding the hole-digging region C, and scattered points 2211 in the scatter structure may be distributed in a circle coaxial with the hole-digging region C. The light-emitting region of the second light-emitting component 22 may be a scattered light-emitting region surrounding the hole-digging region C. The light-emitting pattern may be beautiful and concise, which may improve the user's experience.

In one embodiment, referring to FIG. 9, there may be 12 scattered points 2211 of the second anode around the hole-digging region C. By changing a voltage between each scattered point of the second anode 221 and the second cathode 223, the state of a corresponding region of the second organic light-emitting layer 222 may be changed. In one embodiment, in view of this, the light emitted by the second light-emitting component 22 may be configured for a special reminder function, or may be configured for a lighting function, etc.

Figure 10:
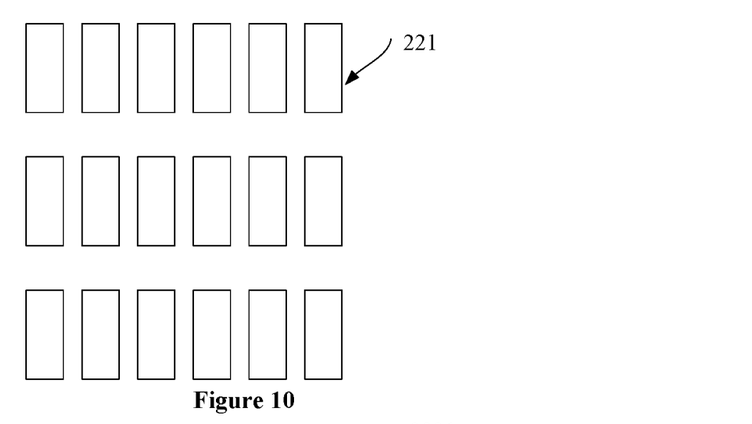
FIG. 10 illustrates a schematic diagram of another exemplary second anode consistent with disclosed embodiments of the present disclosure.

In one embodiment, referring to FIG. 10, the second anode 221 may have an array structure surrounding the hole-digging region C. For example, the array structure of the second anode 221 may enable the light-emitting region of the second light-emitting component 22 to be an array-shaped light-emitting region surrounding the hole-digging region C.

Figure 11:
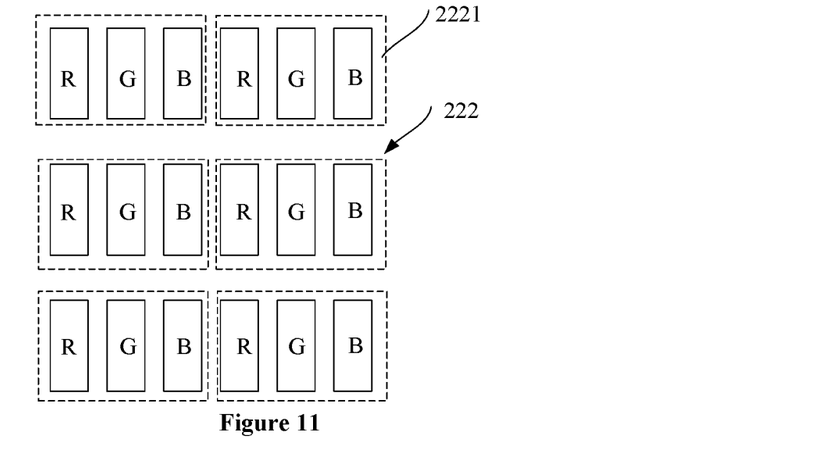
FIG. 11 illustrates a schematic diagram of another exemplary second organic light-emitting layer consistent with disclosed embodiments of the present disclosure.

In another embodiment, referring to FIG. 11, the second organic light-emitting layer 222 formed by an entire-surface-evaporation may include light-emitting units distributed in an array. Each light-emitting unit may include sequentially arranged organic light-emitting units of at least three colors. For example, the organic light-emitting units of three colors may include a red organic light-emitting unit R, a blue organic light-emitting unit B, and a green organic light-emitting unit G.

Around the hole-digging region C, each unit distributed in an array in the array structure of the second anode 221 may correspond to each organic light-emitting unit distributed in an array in the second organic light-emitting layer 222. In other words, each organic light-emitting unit in the second organic light-emitting layer 222 around the hole-digging region C may be disposed between a separate second anode and the second cathode, to form a pixel structure. By changing the voltage between each second anode and the second cathode, the light-emitting state of a corresponding organic light-emitting unit may be changed, respectively, thereby changing the light-emitting state of each light-emitting unit. In one embodiment, in such structure, the second light-emitting component may be configured for special reminder and lighting. Further, because the pixel structure is formed in the second light-emitting component, the second light-emitting component 22 may achieve a function of displaying a color image.

In the disclosed display panel, the light-emitting region of the second light-emitting component 22 may be limited by a combined structure of the second organic light-emitting layer 222 and the second anode 221. For example, when the second organic light-emitting layer 222 has the scatter structure as illustrated in FIG. 6, and the second anode has the scatter structure as illustrated in FIG. 9, the orthographic projection of the scatter structure of the second organic light-emitting layer on the array substrate may coincide with the orthographic projection of the scatter structure of the second anode on the array substrate. In other words, a scattered point of the second organic light-emitting layer may be disposed between a scattered point of the second anode and the second cathode.

In one embodiment, referring to FIG. 6, the second organic light-emitting layer may have 12 scattered points. In other words, the second light-emitting component may have 12 scattered light-emitting regions, and the 12 scattered light-emitting regions may correspond to the 12 different time points/hours as in a clock. By controlling a voltage between different scattered point of the second anode 221 and the second cathode 223, the light-emitting state of a corresponding scattered point of the second organic light-emitting layer may be controlled, which may achieve a time reminder function.

In another embodiment, by applying a different voltage between different scattered point of the second anode and the cathode, luminous brightness of different scattered point of the second organic light-emitting layer 222 may be gradually changed, which may enhance the beauty of the reminder pattern and the user's experience. The color of the light emitted from the plurality of scattered points of the second organic light-emitting layer 222 may be designed to be the same or different.

Figure 12:
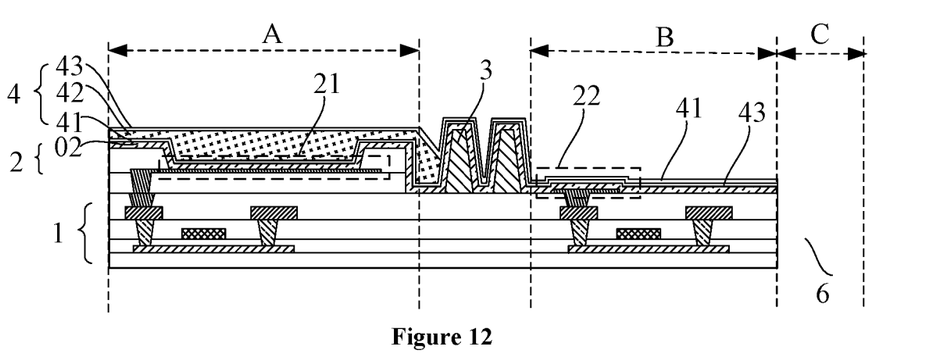
FIG. 12 illustrates a cross-sectional view of another exemplary display panel consistent with disclosed embodiments of the present disclosure.

In the disclosed display panel, referring to FIG. 12, the light-emitting function layer 2 may include a vapor-deposited film layer 02 formed by an entire-surface-evaporation. The vapor-deposited film layer 02 may include an organic light-emitting layer and a cathode (not illustrated in FIG. 12) that are sequentially stacked. In one embodiment, the vapor-deposited film layer 02 may include a hole injection layer, a hole transport layer, an organic light-emitting layer, an electron transport layer, an electron injection layer, a cathode, and any other film layer (not illustrated in FIG. 12) that are sequentially stacked.

When forming the light-emitting function layer 2, an entire anode metal layer may be first evaporated on the array substrate 1, and then the anode metal layer may be patterned to form the first anode 211 disposed over the display region A and the second anode 221 disposed over the boundary region B. Then, the organic light-emitting layer and the cathode may be sequentially formed by an entire-surface evaporation over the array substrate 1. The organic light-emitting layer may include the first organic light-emitting layer 212 disposed over the display region A and the second organic light-emitting layer 222 disposed over the boundary region B. The cathode may include the first cathode 213 disposed over the display region A and the second cathode 223 disposed over the boundary region B.

Because the light-emitting function layer 2 includes the vapor-deposited film layer 02 that desires to be formed by an entire-surface-evaporation over the array substrate, in the disclosed embodiments of the present disclosure, a portion of the vapor-deposited film layer 02 disposed over the boundary region may be used to form the second light-emitting component, which may effectively improve the utilization efficiency of the boundary region, may increase the functional structure of the display panel, and may improve the user's experience.

In the disclosed display panel, referring to FIG. 12, because the light-emitting function layer 2 tends to be invaded by water vapor and oxygen in the air, to block the intrusion of water vapor and oxygen, a thin-film encapsulation layer 4 may be formed to cover a side of the light-emitting function layer 2 facing away from the array substrate 1. The light-emitting function layer 2 may be encapsulated between the thin-film encapsulation layer 4 and the array substrate 1, and water and oxygen may be prevented from intruding the light-emitting function layer 2.

The thin-film encapsulation layer 4 may include an inorganic thin-film encapsulation layer and an organic thin-film encapsulation layer that are alternately and sequentially stacked. The organic thin-film encapsulation layer may be extended from the display region A toward the hole-digging region C, and may end at the dam structure 3. The inorganic thin-film encapsulation layer may be extended across the dam structure 3. In other words, the thin-film encapsulation layer disposed over the display region A may include the inorganic thin-film encapsulation layer and the organic thin-film encapsulation layer that are alternately and sequentially stacked, and the thin-film encapsulation layer disposed over the boundary region B may merely include the inorganic thin-film encapsulation layer.

In one embodiment, referring to FIG. 12, the thin-film encapsulation layer 4 may include a first inorganic thin-film encapsulation layer 41, a first organic thin-film encapsulation layer 42, and a second inorganic thin-film encapsulation layer 43 that are sequentially stacked. The first organic thin-film encapsulation layer 42 may be extended from the display region A toward the hole-digging region C, and may end at the dam structure 3. The first inorganic thin-film encapsulation layer 41 and the second inorganic thin-film encapsulation layer 43 may be extended across the dam structure 3. The first inorganic thin-film encapsulation layer 41 and the second inorganic thin-film encapsulation layer 43 may effectively prevent water vapor and oxygen in external environment from invading the light-emitting function layer 2 inside the display panel, and may solve aging and failure issues of the light-emitting function layer 2 caused by invasion of water and oxygen in external environment into the light-emitting function layer 2.

The first organic thin-film encapsulation layer 42 may be disposed between the first inorganic thin-film encapsulation layer 41 and the second inorganic thin-film encapsulation layer 43. The polymer of the first organic thin-film encapsulation layer 42 may effectively fill the defects formed during the manufacturing process of the first inorganic thin-film encapsulation layer 41 and the second inorganic thin-film encapsulation layer 43. Therefore, water and oxygen may be prevented from diffusing at the defects of the first inorganic thin-film encapsulation layer 41 or the second inorganic thin-film encapsulation layer 43, which may further improve the ability of thin-film transistor to block water and oxygen, and may improve the service life of the display panel.

In the disclosed display panel, the array substrate 1 may further include an annular partition structure 5 surrounding the hole-digging region C. The annular partition structure 5 may include at least one first annular partition 51 disposed between the first light-emitting component 21 and the second light-emitting component 22. A first annular partition 51 of the at least one first annular partition 51 may be configured to separate the vapor-deposited film layer 02 of the light-emitting function layer 2 formed by an entire-surface-evaporation, and may be further configured to disconnect the connection between the first light-emitting component 21 and the second light-emitting component 22.

Figure 13A:
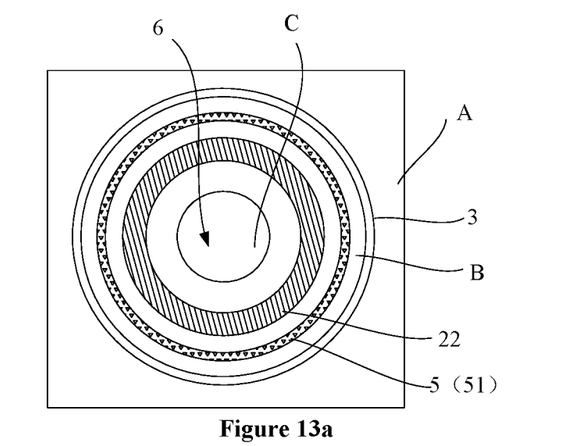
FIG. 13a illustrates a schematic diagram of an exemplary annular partition structure consistent with disclosed embodiments of the present disclosure.
Figure 13B:
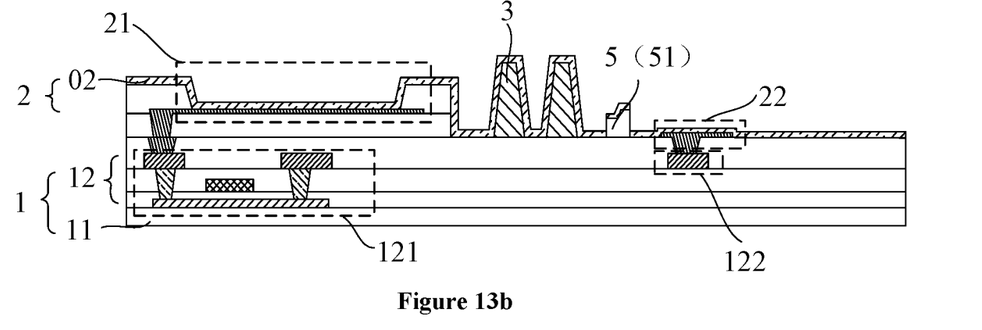
FIG. 13b illustrates a cross-sectional view of another exemplary display panel consistent with disclosed embodiments of the present disclosure.

In one embodiment, referring to FIG. 13a and FIG. 13b, the first annular partition 51 may be disposed between the dam structure 3 and the second light-emitting structure. The first annular partition 51 may separate the vapor-deposited film layer 02 of the light-emitting function layer 2 formed by an entire-surface-evaporation, and may further disconnect the connection between the first light-emitting component 21 and the second light-emitting component 22.

Figure 14A:
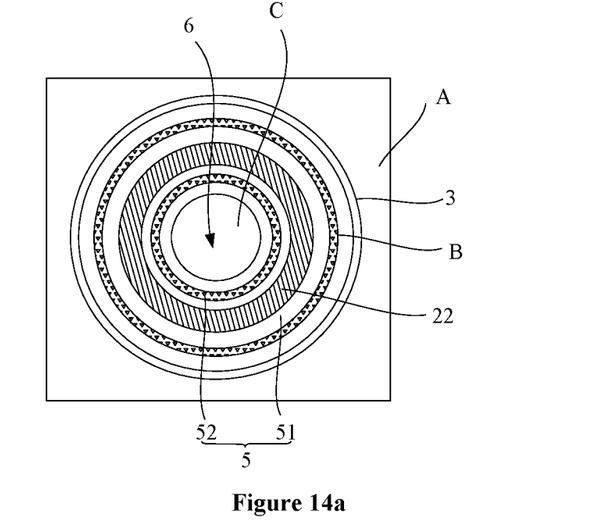
FIG. 14a illustrates a schematic diagram of another exemplary annular partition structure consistent with disclosed embodiments of the present disclosure.
Figure 14B:
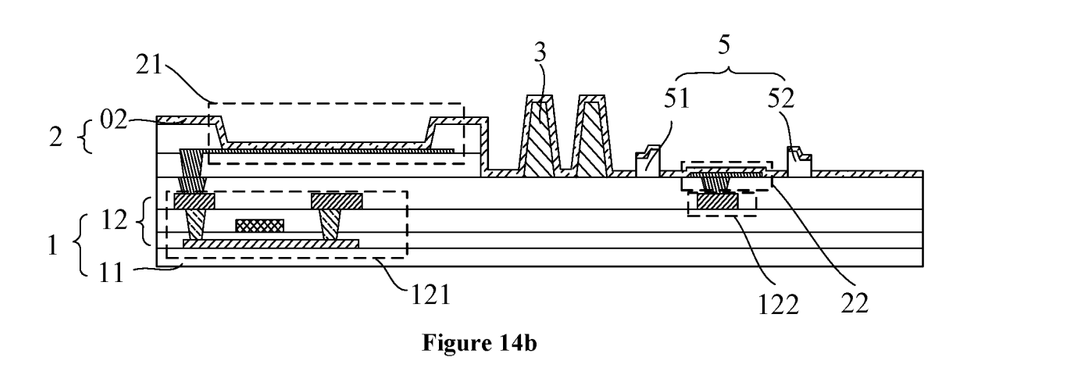
FIG. 14b illustrates a cross-sectional view of another exemplary display panel consistent with disclosed embodiments of the present disclosure.

In one embodiment, because certain film layer in the light-emitting function layer 2 desires to be formed by an entire-surface evaporation, when forming the through-hole 6 penetrating through the display panel by a laser cutting in the hole-digging region C, the film layer of the light-emitting function layer 2 may be in contact with the water vapor and oxygen of the outside air at the through-hole 6. To prevent outside water and oxygen from invading the inside of the display panel, referring to FIG. 14a and FIG. 14b (merely one layer of a plurality of layers of the vapor-deposited film layer 02 formed by entire-surface-evaporation in the light-emitting function layer 2 is illustrated in FIG. 14b), the annular partition structure 5 may further include at least one second annular partition 52 disposed between the second light-emitting component 22 and the edge of the hole-digging region C. A second annular partition 52 of the at least one second annular partition 52 may separate the vapor-deposited film layer 02 formed by an entire-surface-evaporation in the light-emitting function layer 2 disposed between the second light-emitting component 22 and the hole-digging region C. Therefore, water and oxygen may be prevented from diffusing in the light-emitting function layer 2, and the first light-emitting component 21 and the second light-emitting component 22 may be protected from be invaded by water and oxygen, thereby improving the service life of the display panel.

Figure 15:
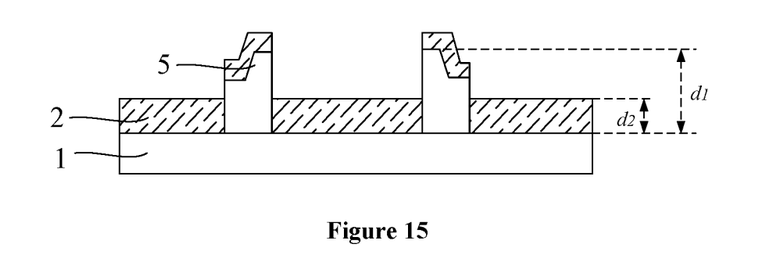
FIG. 15 illustrates a schematic diagram of another exemplary annular partition structure consistent with disclosed embodiments of the present disclosure.

In one embodiment, referring to FIG. 15, in a direction perpendicular to the plane where the display panel is located, a height of the annular partition structure 5 may be greater than a thickness of the light-emitting function layer 2, such that the entire film layers formed by an entire-surface-evaporation in the light-emitting function layer 2 may be separated, which may facilitate preventing water and oxygen from invading the inside of the display panel.

In the disclosed display panel, the first thin-film transistor device layer 121 may include a plurality of first thin-film transistor driving units electrically connected to the first light-emitting component 21, and signal lines for providing driving signals to the first thin-film transistor driving units. The first thin-film transistor driving unit may include at least one thin-film transistor and at least one capacitor. The first thin-film transistor driving unit may receive a signal from the signal line and may transmit a driving current to the first light-emitting component 21 to drive the first light-emitting component 21 to emit light. In one embodiment, the first thin-film transistor driving unit may have a 7T1C structure or a 2T1C structure, which may be determined according to practical applications, and may not be limited herein.

In one embodiment, when forming the first thin-film transistor device layer 121 over the base substrate 11, each film layer of the first thin-film transistor device layer 121 may include a gate metal layer, a source-drain metal layer, and a capacitor metal layer that are sequentially stacked. The gate metal layer may be configured as a gate wiring of the thin-film transistor, and the source-drain metal layer may be configured as the source and drain wiring of the thin-film transistor. The annular partition structure 5 may be formed by stacking a plurality of layers. The annular partition structure 5 may include a metal structure 051. The metal structure 051 of the annular partition structure 5 may be same-layer formed with at least one of the gate metal layer, the source-drain metal layer, and the capacitor metal layer.

Figure 16A:
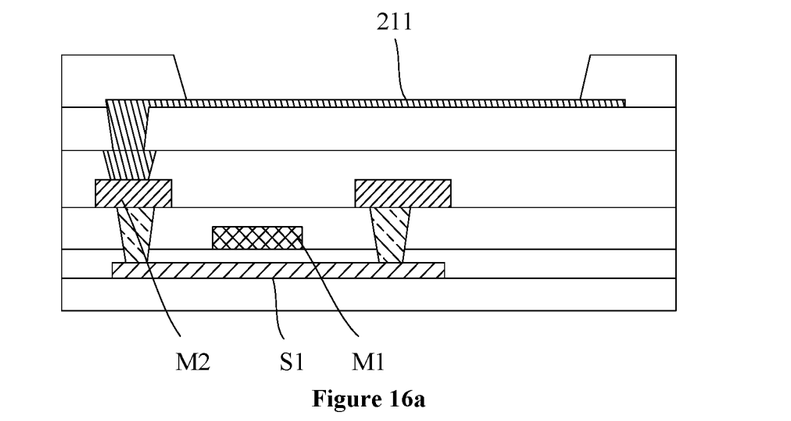
FIG. 16a illustrates a schematic diagram of an exemplary first thin-film transistor device layer consistent with disclosed embodiments of the present disclosure.

For example, referring to FIG. 16a, the first thin-film transistor device layer 121 may include a first semiconductor layer S1, a first metal layer M1, and a second metal layer M2 that are sequentially stacked. The first semiconductor layer S1 may be made of a material including low temperature polysilicon (LTPS). The first metal layer M1 may be the gate metal layer, and the second metal layer M2 may be the source-drain metal layer. The first semiconductor layer S1, the first metal layer M1, and the second metal layer M2 may form a thin-film transistor T1. A drain of the thin-film transistor T1 may be electrically connected to the first anode

211. The annular partition structure 5 may be same-layer formed with at least one of the first metal layer M1 and the second metal layer M2.

The first thin-film transistor device layer 121 may further include a plurality of thin-film transistors. In one embodiment, referring to FIG. 16b, the first thin-film transistor device layer 121 may include a first semiconductor layer S1, a first metal layer M1, a second metal layer M2, a capacitor metal layer MC, a second semiconductor layer S2, a third metal layer M3, and a fourth metal layer M4 that are sequentially stacked. The first semiconductor layer S1 may be made of a material including low temperature polysilicon (LTPS). The second semiconductor layer S2 may be made of a material including indium gallium zinc oxide (IGZO). The first metal layer M1 and the third metal layer M3 may be the gate metal layer, and the second metal layer M2 and the fourth metal layer M4 may be the source-drain metal layer. An interlayer insulation layer may be disposed between the above-mentioned each film layer.

Figure 16B:
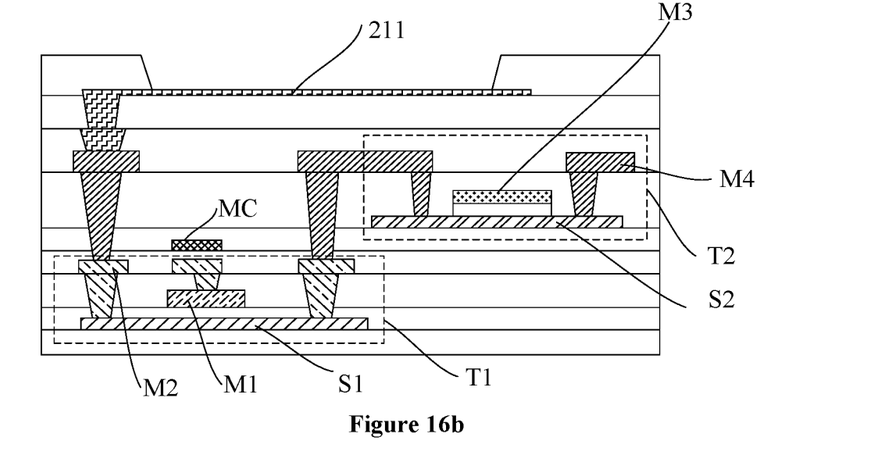
FIG. 16b illustrates a schematic diagram of another exemplary first thin-film transistor device layer consistent with disclosed embodiments of the present disclosure.

The first semiconductor layer S1, the first metal layer M1, and the second metal layer M2 may form a thin-film transistor T1. The first semiconductor layer S1 may form an active layer of the thin-film transistor T1, the first metal layer M1 may form a gate of the thin-film transistor T1, and the second metal layer M2 may form the source and drain of the thin-film transistor T1. The second semiconductor layer S2, the third metal layer M3, and the fourth metal layer M4 may form a thin-film transistor T2. The second semiconductor layer S2 may form an active layer of the thin-film transistor T2, the third metal layer M3 may form a gate of the thin-film transistor T2, and the fourth metal layer M4 may form source and drain of the thin-film transistor T2. The drain of the thin-film transistor T2 may be electrically connected to the source of the thin film transistor T1, and the drain of the thin-film transistor T1 may be electrically connected to the first anode 211.

Figure 17:
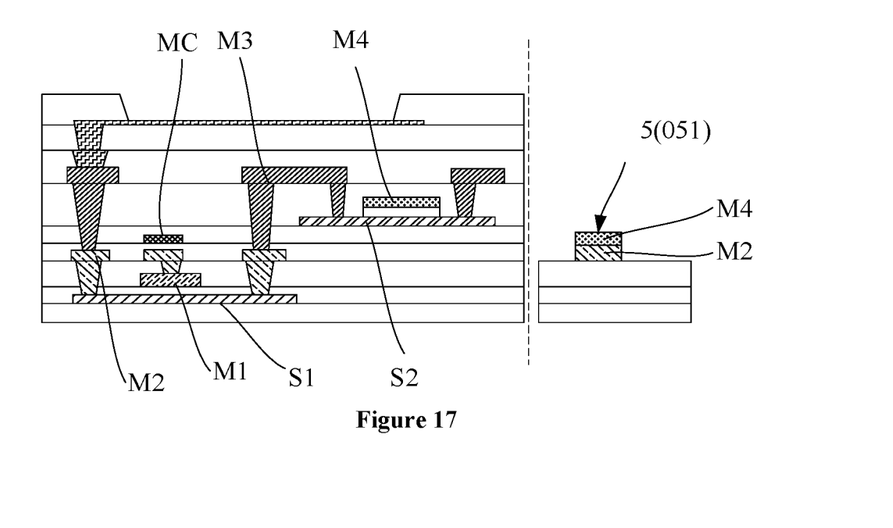
FIG. 17 illustrates a schematic diagram of another exemplary annular partition structure consistent with disclosed embodiments of the present disclosure.

In one embodiment, the annular partition structure 5 may be same-layer formed with at least one of the first metal layer M1, the second metal layer M2, the third metal layer M3, the fourth metal layer M4, and the capacitor metal layer MC. In other words, the metal structure 051 of the annular partition structure 5 may be same-layer formed with any one of the first metal layer M1, the second metal layer M2, the third metal layer M3, the fourth metal layer M4, and the capacitor metal layer MC. Alternatively, the metal structure 051 of the annular partition structure 5 may be same-layer formed with at least two metal layers of the first metal layer M1, the second metal layer M2, the third metal layer M3, the fourth metal layer M4, and the capacitor metal layer MC. The same-layer formation may refer to that the metal structure 051 of the annular partition structure 5 may be formed through a same process as at least one of the above-mentioned metal layers. Referring to FIG. 17, the metal structure 051 of the annular partition structure 5 may be same-layer formed with the second metal layer M2 and the fourth metal layer M4.

In one embodiment, the metal structure 051 of the annular partition structure 5 may be same-layer formed with the second semiconductor layer S2. In another embodiment, the metal structure 051 of the annular partition structure 5 may be same-layer formed with the second anode 221. In certain embodiments, the first thin-film transistor device layer 121 may further include any other metal layer, and the metal structure 051 of the annular partition structure 5 may be formed from any other metal layer.

Figure 18:
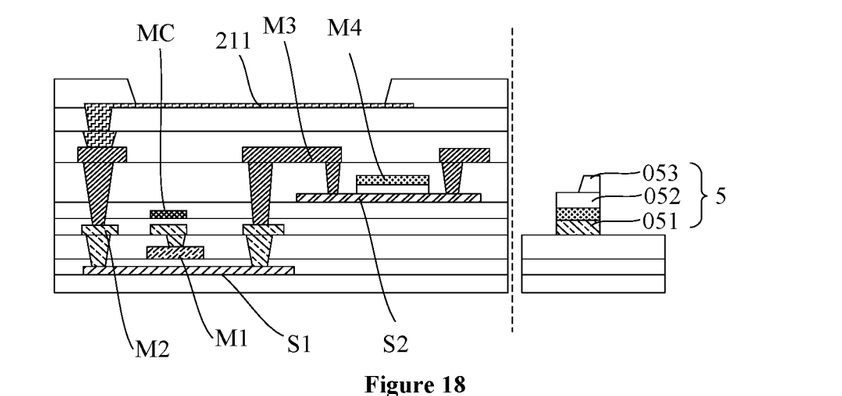
FIG. 18 illustrates a schematic diagram of another exemplary annular partition structure consistent with disclosed embodiments of the present disclosure.

In one embodiment, the annular partition structure 5 may further include a protection structure disposed on a side of the metal structure 051 facing away from the base substrate 11. The protection structure may be made of a material including an inorganic material and/or an organic material. Referring to FIG. 18, the protection structure may include an inorganic material layer 052 and an organic material layer 053.

In the disclosed display panel, during the process of forming the through-hole 6 by laser cutting in the hole-digging region C, cracks may be generated in the film layer surrounding the through-hole 6. The cracks may expand to the inside of the display panel and may damage the circuit, thereby causing abnormal display of the display panel. At the same time, impurities from the outside, e.g., water vapor, and dust, etc., may easily enter the inside of the display panel from the cracks, which may reduce the reliability of the display panel.

Figure 19:
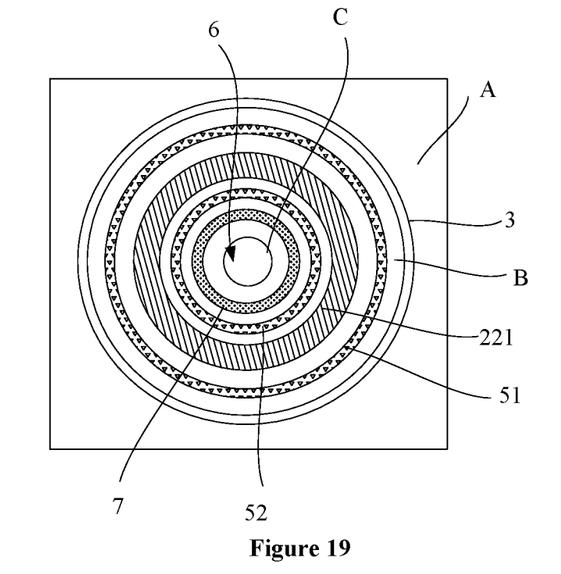
FIG. 19 illustrates a schematic diagram of an exemplary crack-blocking portion consistent with disclosed embodiments of the present disclosure.

To prevent the cracks from extending to the region where the first light-emitting component 21 and the second light-emitting component 22 are located, referring to FIG. 19, the array substrate 1 may further include a crack-blocking portion 7 disposed between the second light-emitting component 22 and the hole-digging region C and surrounding the hole-digging region C. The crack-blocking portion 7 may be made of a material including an organic material.

Figure 20:
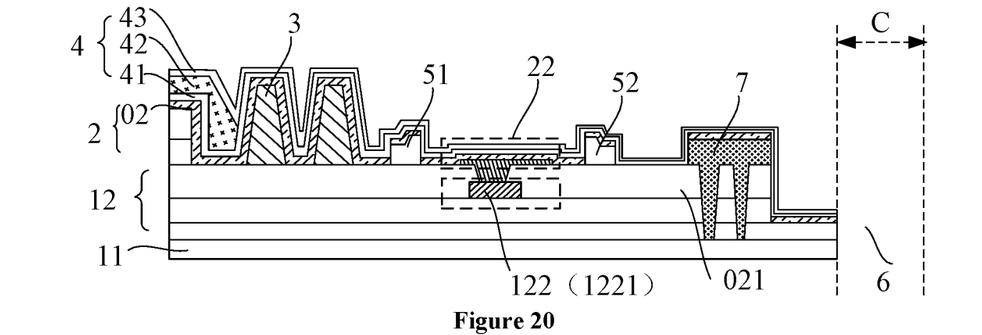
FIG. 20 illustrates a cross-sectional view of another exemplary display panel consistent with disclosed embodiments of the present disclosure.

Referring to FIG. 20, a region of the array substrate 1 adjacent to the hole-digging region C may include a first insulating layer 021 formed by stacking interlayer insulating layers in the driving device layer 12 and the base substrate 11. The first insulating layer may include at least one groove surrounding the hole-digging region C. The crack-blocking portion 7 may include a branch filled into each of the at least one groove. Because the crack-blocking portion 7 is made of an organic material, and the organic material has high flexibility, the branch of the crack-blocking portion 7 filled into the first insulating layer 021 may prevent the cracks in the first insulating layer 021 from extending to the display region A, and may improve the service life of the display panel.

In the disclosed display panel, to accurately detect whether a crack is generated around the hole-digging region C, the display panel may further include a crack detection unit. To simplify the manufacturing process, at least one of the first annular partition 51 and the second annular partition 52 may include the crack detection unit. Because the annular partition structure 5 includes the metal structure 051, the annular partition structure 5 may be conductive, and the crack detection unit may be provided with a fixed potential. In one embodiment, when a crack is generated around one of the first annular partition 51 and the second annular partition 52 as the crack detection unit, the crack detection unit may be disconnected, and a detection device may determine whether the crack is generated by detecting the resistance change of the crack detection unit. If a crack is detected in the display panel, the display panel may be eliminated, which may improve the production yield.

Figure 21:
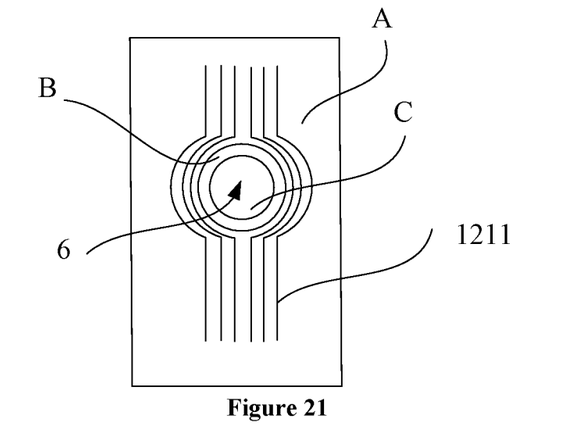
FIG. 21 illustrates an exemplary layout diagram of signal lines consistent with disclosed embodiments of the present disclosure.
Figure 22:
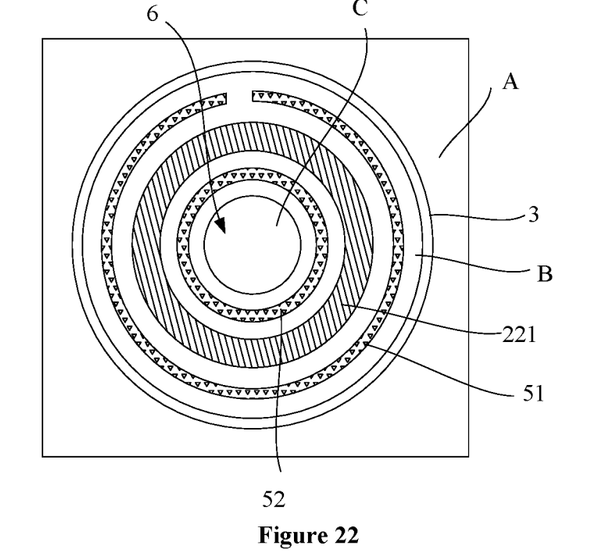
FIG. 22 illustrates a schematic diagram of another exemplary annular partition structure consistent with disclosed embodiments of the present disclosure.

In the disclosed display panel, referring to FIG. 21, because the display region A surrounds the hole-digging region C, the through-hole 6 for disposing a front camera may be formed in the hole-digging region, and signal wires 1211 in the display region A may desire to avoid the hole-digging region C. However, the signal wires 1211 near the hole-digging region C may be arranged too densely, and capacitive coupling between the signal wires 1211 may be likely to occur, which may cause uneven display brightness of the display device and a streaking phenomenon. To avoid such uneven display brightness phenomenon, referring to FIG. 22, at least one of the first annular partition 51 and the second annular partition 52 may have an unclosed ring structure having a gap. The first annular partition 51 and/or the second annular partition 52 having such a structure may be configured as a shielding layer, which may reduce the coupling between the signal wires 1211 near the hole-digging region C, and may improve the uneven display brightness phenomenon caused by the coupling of the display panel.

Figure 23:
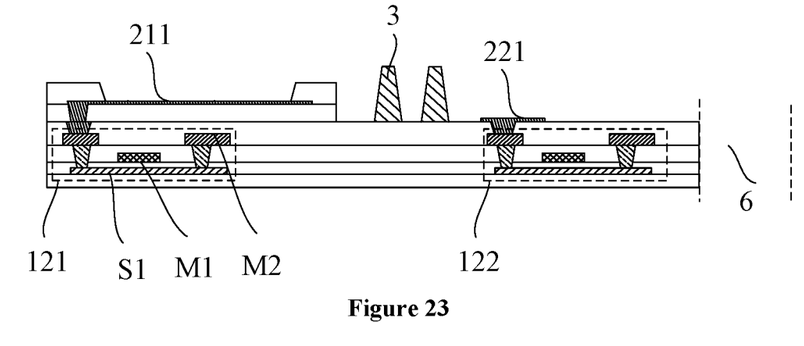
FIG. 23 illustrates a cross-sectional view of another exemplary display panel consistent with disclosed embodiments of the present disclosure.

In the disclosed display panel, the boundary driving circuit layer 122 disposed over the boundary region B may be a second thin-film transistor device layer for driving the second light-emitting component 22 to emit light. Referring to FIG. 23, the first thin-film transistor device layer 121 may include the first semiconductor layer S1, the first metal layer M1, and the second metal layer M2 that are sequentially stacked. The first semiconductor layer S1 may be made of a material including low temperature polysilicon (LTPS), the first metal layer M1 may be the gate metal layer, and the second metal layer M2 may be the source-drain metal layer. The second thin-film transistor device layer may be same-layer formed with the first thin-film transistor device layer 121.

In one embodiment, the second thin-film transistor device layer may include a second thin-film transistor driving unit electrically connected to the second anode 221. The second thin-film transistor driving unit may have a same structure as the first thin-film transistor driving unit. To simplify the manufacturing process, each film layer of the second thin-film transistor driving unit may be same-layer formed with each film layer of the first thin-film transistor driving unit.

The second thin-film transistor driving unit may have a structure different from the first thin-film transistor driving unit. To simplify the manufacturing process, each film layer of the second thin-film transistor driving unit may be same-layer formed with a certain film layer of the first thin-film transistor driving unit. When the boundary driving circuit layer 122 is the second thin-film transistor device layer, the annular partition structure 5 may be disposed above the second thin-film transistor device layer, and the metal structure 051 of the annular partition structure may be disposed in a layer different from the second thin-film transistor device layer.

In the disclosed display panel, the boundary driving circuit layer 122 may be a driving device for driving the second light-emitting component 22 to emit light over the boundary region B. Because the second light-emitting structure is mainly for lighting or special reminder functions, the display requirements may not be substantially high. To simplify the manufacturing process and save cost, referring to FIG. 23, the boundary driving circuit layer 122 may include a signal lead 1221 electrically connected to the second anode 221 and configured to drive the second light-emitting component 22 to emit light. By applying a high potential voltage to the signal lead 1221, the second light-emitting component 22 may emit light. The high potential voltage may be the same as a high potential voltage applied to the first light-emitting component 21, or may be an externally applied higher potential voltage, to facilitate achieving the lighting function.

In the second light-emitting component 22, when a quantity of the second anodes 221 is one, a quantity of the signal leads 1221 may be one. When the second anode 221 has a scatter structure or an array structure, a plurality of signal leads 1221 may be electrically connected to scattered points in the scatter structure or each unit in the array structure in a one-to-one correspondence, and may be configured to drive the second light-emitting component 22 to emit light.

Figure 24:
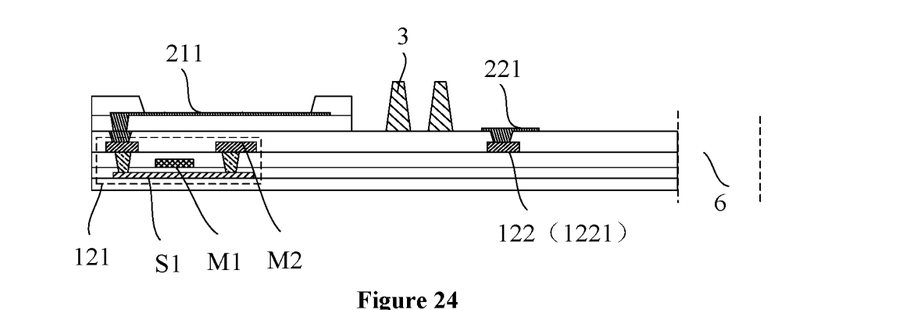
FIG. 24 illustrates a cross-sectional view of another exemplary display panel consistent with disclosed embodiments of the present disclosure.

In one embodiment, each film layer of the first thin-film transistor device layer 121 may include a gate metal layer, a source-drain metal layer, and a capacitor metal layer that are sequentially stacked. The gate metal layer may be configured as a gate wiring of the thin-film transistor. The source-drain metal layer may be configured as the source and drain wiring of the thin-film transistor. The signal lead 1221 may be same-layer formed with any one of the gate metal layer, the source-drain metal layer, and the capacitor metal layer. For example, referring to FIG. 24, the signal lead 1221 may same-layer formed with any one of the first metal layer M1 and the second metal layer M2.

Figure 25:
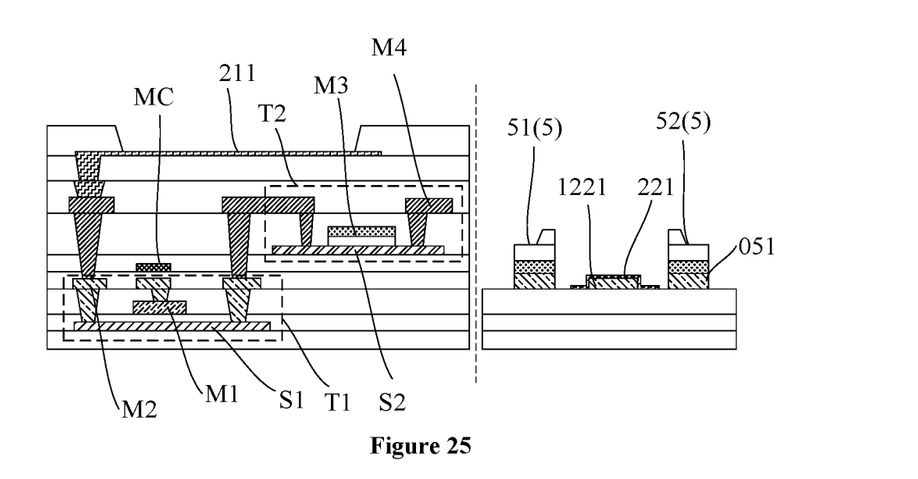
FIG. 25 illustrates a cross-sectional view of another exemplary display panel consistent with disclosed embodiments of the present disclosure.

In one embodiment, when the first thin-film transistor device layer 121 includes a plurality of thin-film transistors, referring to FIG. 25, the first thin-film transistor device layer 121 may include a first semiconductor layer S1, a first metal layer M1, a second metal layer M2, a capacitor metal layer MC, a second semiconductor layer S2, a third metal layer M3, and a fourth metal layer M4 that are sequentially stacked. The first semiconductor layer S1 may be made of a material including low temperature polysilicon (LTPS). The second semiconductor layer S2 may be made of a material including indium gallium zinc oxide (IGZO). The first metal layer M1 and the third metal layer M3 may be the gate metal layer, and the second metal layer M2 and the fourth metal layer M4 may be the source-drain metal layer. An interlayer insulation layer may be disposed between the above-mentioned each film layer.

The first semiconductor layer S1, the first metal layer M1, and the second metal layer M2 may form a thin-film transistor T1. The first semiconductor layer S1 may form an active layer of the thin-film transistor T1, the first metal layer M1 may form a gate of the thin-film transistor T1, and the second metal layer M2 may form the source and drain of the thin-film transistor T1. The second semiconductor layer S2, the third metal layer M3, and the fourth metal layer M4 may form a thin-film transistor T2. The second semiconductor layer S2 may form an active layer of the thin-film transistor T2, the third metal layer M3 may form a gate of the thin-film transistor T2, and the fourth metal layer M4 may form source and drain of the thin-film transistor T2. The drain of the thin-film transistor T2 may be electrically connected to the source of the thin film transistor T1, and the drain of the thin-film transistor T1 may be electrically connected to the first anode 211.

In one embodiment, to simplify the manufacturing process of the display panel and to improve production efficiency, the signal lead 1221 may be same-layer formed with any one of the first metal layer M1, the second metal layer M2, the third metal layer M3, the fourth metal layer M4, and the capacitor metal layer MC. For example, referring to FIG. 25, the signal lead 1221 may be same-layer formed with the second metal layer M2. In other words, the signal lead 1221 and the second metal layer M2 may be formed through a same manufacturing process, and the signal lead 1221 and the second metal layer M2 may be same-layer formed and made of a same material.

In one embodiment, the signal lead 1221 may be same-layer formed with the second semiconductor layer S2. The second semiconductor layer S2 may be made of a material including indium gallium zinc oxide (IGZO). Indium gallium zinc oxide (IGZO) may be conductive, and there may be few wiring in the second semiconductor layer S2, which may avoid the problem of difficulty in winding the signal leads 1221. In another embodiment, the signal lead 1221 may be same-layer formed with the second anode 221.

In one embodiment, referring to FIG. 25, the signal lead 1221 may be same-layer formed with the metal structure 051 of the annular partition structure 5. In another embodiment, the signal lead 1221 may be formed in a layer different from the metal structure 051 of the annular partition structure 5.

The present disclosure further provides a display device. The display device may include a display panel in any one of disclosed embodiments. The display device may be any product or component having a display function, e.g., a mobile phone, a tablet computer, a display, and a notebook computer, etc. Any other essential component of the display device may be understood by those skilled in the art, which is not repeated herein and is not intended to limit the present disclosure.

In the disclosed display panel and the display device, the display panel may include the display region, the hole-digging region surrounded by the display region, and the boundary region disposed between the display region and the hole-digging region. In one embodiment, the display panel may include the array substrate and the light-emitting function layer disposed over the array substrate. The array substrate may include the base substrate and the driving device layer disposed on the base substrate. In the boundary region surrounding the hole-digging region, the driving device layer may include the boundary driving circuit layer, and the light-emitting function layer may include at least one second light-emitting component. The driving device layer may be electrically connected to each of the at least one second light-emitting component. In such structure, the driving device layer may drive the second light-emitting component to emit light, such that the boundary region around the hole-digging region may have a display or light-emitting effect, may effectively utilize the region around the hole-digging region, may increase the functional structure of the display panel, and may improve the user's experience.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a display region, a hole-digging region surrounded by the display region, and a boundary region disposed between the display region and the hole-digging region;
an array substrate, wherein the array substrate includes a dam structure disposed between the display region and the boundary region and surrounding the hole-digging region; and
a light-emitting function layer, wherein the light-emitting function layer covers the array substrate, and includes a first light-emitting component disposed over the display region and a second light-emitting component disposed over the boundary region, wherein:
the array substrate further includes a base substrate and a driving device layer disposed over the base substrate, and the driving device layer includes a first thin-film transistor device layer disposed over the display region and a boundary driving circuit layer disposed over the boundary region, and the first thin-film transistor device layer is electrically connected to the first light-emitting component, and the boundary driving circuit layer is electrically connected to the second light-emitting component.

2. The display panel according to claim 1, wherein:
the first light-emitting component includes a first anode, a first organic light-emitting layer, and a first cathode that are sequentially stacked over the display region; and
the second light-emitting component includes a second anode, a second organic light-emitting layer, and a second cathode that are sequentially stacked over the boundary region, wherein:
the first cathode is same-layer formed with the second cathode.

3. The display panel according to claim 2, wherein:
the second organic light-emitting layer has a ring structure surrounding the hole-digging region.

4. The display panel according to claim 3, wherein:
the second organic light-emitting layer includes at least one layer of a red organic light-emitting layer, a blue organic light-emitting layer, and a green organic light-emitting layer.

5. The display panel according to claim 2, wherein:
the second organic light-emitting layer has a scatter structure surrounding the hole-digging region, and scattered points of the scatter structure of the second organic light-emitting layer are distributed in a ring coaxial with the hole-digging region.

6. The display panel according to claim 2, wherein:
the second organic light-emitting layer has an array structure surrounding the hole-digging region.

7. The display panel according to claim 2, wherein:
the first organic light-emitting layer is same-layer formed with the second organic light-emitting layer.

8. The display panel according to claim 7, wherein:
the second anode has a ring structure surrounding the hole-digging region.

9. The display panel according to claim 7, wherein:
the second anode has a scatter structure surrounding the hole-digging region, and scattered points of the scatter structure of the second anode are distributed in a ring coaxial with the hole-digging region.

10. The display panel according to claim 7, wherein:
the second anode has an array structure surrounding the hole-digging region.

11. The display panel according to claim 2, wherein:
the boundary driving circuit layer includes a signal lead electrically connected to the second anode and configured to drive the second light-emitting component to emit light.

12. The display panel according to claim 11, wherein:
the first thin-film transistor device layer includes a gate metal layer, a source-drain metal layer, and a capacitor metal layer that are sequentially stacked, wherein the gate metal layer is configured as a gate wiring of a thin-film transistor, and the source-drain metal layer is configured as source and drain wirings of the thin-film transistor, and
the signal lead is same-layer formed with any one of the gate metal layer, the source-drain metal layer, and the capacitor metal layer.

13. The display panel according to claim 1, wherein:
the array substrate further includes an annular partition structure surrounding the hole-digging region, wherein the annular partition structure includes at least one first annular partition disposed between the first light-emitting component and the second light-emitting component and configured to separate the light-emitting function layer.

14. The display panel according to claim 13, wherein:
the annular partition structure further includes at least one second annular partition disposed between the second light-emitting component and an edge of the hole-digging region.

15. The display panel according to claim 14, wherein:
in a direction perpendicular to a plane where the display panel is located, a height of the annular partition structure is greater than a thickness of the light-emitting function layer.

16. The display panel according to claim 15, wherein:
the first thin-film transistor device layer includes a gate metal layer, a source-drain metal layer, and a capacitor metal layer that are sequentially stacked, wherein the gate metal layer is configured as a gate wiring of a thin-film transistor, and the source-drain metal layer is configured as source and drain wirings of the thin-film transistor, and
the annular partition structure includes a metal structure, and the annular partition structure is same-layer formed with at least one of the gate metal layer, the source-drain metal layer, and the capacitor metal layer.

17. The display panel according to claim 16, wherein:
at least one of a first annular partition of the at least one first annular partition and a second annular partition of the at least one second annular partition includes a crack detection unit, wherein the crack detection unit is provided with a fixed potential.

18. The display panel according to claim 16, wherein:
at least one of a first annular partition of the at least one first annular partition and a second annular partition of the at least one second annular partition has an unclosed ring structure having a gap.

19. The display panel according to claim 16, wherein:
the boundary driving circuit layer includes a second thin-film transistor device layer configured to drive the second light-emitting component to emit light, and the first thin-film transistor device layer is same-layer formed with the second thin-film transistor device layer.

20. A display device, comprising a display panel, wherein the display panel includes:
a display region, a hole-digging region surrounded by the display region, and a boundary region disposed between the display region and the hole-digging region;
an array substrate, wherein the array substrate includes a dam structure disposed between the display region and the boundary region and surrounding the hole-digging region; and
a light-emitting function layer, wherein the light-emitting function layer covers the array substrate, and includes a first light-emitting component disposed over the display region and a second light-emitting component disposed over the boundary region, wherein:
the array substrate further includes a base substrate and a driving device layer disposed over the base substrate, and the driving device layer includes a first thin-film transistor device layer disposed over the display region and a boundary driving circuit layer disposed over the boundary region, and
the first thin-film transistor device layer is electrically connected to the first light-emitting component, and the boundary driving circuit layer is electrically connected to the second light-emitting component.

* * * * *